(12) United States Patent
Qiao et al.

(10) Patent No.: US 11,227,949 B2
(45) Date of Patent: Jan. 18, 2022

(54) POWER SEMICONDUCTOR DEVICES WITH LOW SPECIFIC ON-RESISTANCE

(71) Applicant: University of Electronic Science and Technology of China, Chengdu (CN)

(72) Inventors: Ming Qiao, Chengdu (CN); Longfei Liang, Chengdu (CN); Yilei Lyu, Chengdu (CN); Zhao Qi, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 46 days.

(21) Appl. No.: 16/877,516

(22) Filed: May 19, 2020

(65) Prior Publication Data
US 2021/0273095 A1 Sep. 2, 2021

(30) Foreign Application Priority Data
Feb. 27, 2020 (CN) .......................... 202010125476.3

(51) Int. Cl.
*H01L 29/78* (2006.01)
*H01L 29/66* (2006.01)
*H01L 21/04* (2006.01)

(52) U.S. Cl.
CPC ........ *H01L 29/7835* (2013.01); *H01L 21/046* (2013.01); *H01L 29/66083* (2013.01); *H01L 29/66704* (2013.01)

(58) Field of Classification Search
CPC ......... H01L 29/66613; H01L 29/66681; H01L 29/7816; H01L 29/7824; H01L 29/7835; H01L 29/66083; H01L 29/66704; H01L 21/046; H01L 29/66712; H01L 20/7802; H01L 29/7809; H01L 29/781; H01L 29/66431; H01L 29/66462; H01L 29/66893; H01L 29/7832; H01L 29/8086
See application file for complete search history.

(56) References Cited

U.S. PATENT DOCUMENTS

2018/0286857 A1* 10/2018 Wang ................... H01L 29/7817

* cited by examiner

*Primary Examiner* — Moin M Rahman
*Assistant Examiner* — Mohammad A Rahman
(74) *Attorney, Agent, or Firm* — Bayramoglu Law Offices LLC

(57) ABSTRACT

A low specific on-resistance ($R_{on,sp}$) power semiconductor device includes a power device and a transient voltage suppressor (TVS); wherein the power device comprises a gate electrode, a drain electrode, a bulk electrode, a source electrode and a parasitic body diode, the bulk electrode and the source electrode are shorted, the TVS comprises an anode electrode and a cathode electrode, the drain electrode of the power device and the anode electrode of the TVS are connected by a first metal to form a high-voltage terminal electrode, the source electrode of the power device and the cathode electrode of the TVS are connected by a second metal to form a low-voltage terminal electrode.

18 Claims, 6 Drawing Sheets

US 11,227,949 B2

POWER SEMICONDUCTOR DEVICES WITH LOW SPECIFIC ON-RESISTANCE

CROSS REFERENCE TO THE RELATED APPLICATIONS

The present application is based on and claims priority to Chinese Patent Application No. 202010125476.3, filed on Feb. 27, 2020, the entire contents of which are herein incorporated by reference.

TECHNICAL FIELD

The present invention belongs to the technical field of electronic science which mainly relates to semiconductor technology, and specifically relates to power semiconductor devices.

BACKGROUND

High-voltage power devices are an essential part of the development of high-voltage power integrated circuits. Since the circuit using power devices usually has inductive loads, when the current of inductive loads changes suddenly, a voltage spike will occur across the inductor, which may damage other components. Therefore, the breakdown voltage of power devices is generally required to be much higher than its operating voltage. High-voltage power devices are required to have high breakdown voltage, low on-resistance, and low switching loss. In order to achieve a high breakdown voltage, high-voltage power devices are required to have a low doping concentration in the drift region used to withstand the voltage. But in order to meet a low on-resistance, a high doping concentration is required for the drift region as a current channel. This contradiction restricts the application of high-voltage power devices in high-voltage power integrated circuits, especially in circuits that require low conduction loss and small chip area.

Transient Voltage Suppressor (TVS) is a commonly used novel high-efficiency circuit protection device. It has extremely fast response time (sub-nanoseconds level) and quite high surge absorption capability. When both terminals are subjected to a transient high-energy shock, the TVS can change the impedance value between the two terminals from a high impedance to a low impedance at a very high speed, in order to absorb an instantaneous large current and clamp the voltage at a predetermined value to protect subsequent circuit components from transient high-voltage spikes.

SUMMARY

The problem to be solved by the present invention is to reduce the requirement of breakdown voltage in the power devices for practical applications, and then reduce its specific on-resistance.

In order to achieve the above-mentioned invention purpose, the technical scheme of the present invention is as follows.

A low specific on-resistance power semiconductor device includes: a power device M1 which includes a gate electrode, a drain electrode, a bulk electrode, a source electrode and a parasitic body diode. And the bulk electrode and the source electrode are shorted. A transient voltage suppressor (TVS) T1 includes an anode electrode and a cathode electrode. The drain electrode of the power device and the anode electrode of the TVS are connected by metal to form a high-voltage terminal electrode. The source electrode of the power device and the cathode electrode of the TVS are connected by metal to form a low-voltage terminal electrode.

Preferably, the power semiconductor device includes: a P-type substrate; a first P-type well region located on the left of an upper part of the P-type substrate; a first N-type drift region tangent to the right edge of the first P-type well region; a TVS located on the right of the first N-type drift region; a first P+ contact region and a first N+ contact region located on the upper part of the first P-type well region; a first bulk electrode metal located on the first P+ contact region; a first source electrode metal located on the first N+ contact region; a second N+ contact region located on the right of the upper part of the first N-type drift region; a first drain electrode metal located on the second N+ contact region; a first field oxide region located on the left of the second N+ contact region and partially inside of the first N-type drift region; a first gate oxide layer located on the upper surface of the P-type substrate; and a first polysilicon gate electrode located on the upper surfaces of the first gate oxide layer and the first field oxide region. Among them, the left edge of the first gate oxide layer is tangent to the right edge of the first N+ contact region, and the right edge of the first gate oxide layer is connected to the first field oxide region. Each electrode metal forms an ohmic contact with the heavily doped contact regions which under the electrode metal. The first bulk electrode metal, the first source electrode metal and the first cathode metal of the TVS are connected by metal to form a first low-voltage terminal electrode. The first drain electrode metal and the first anode metal of the TVS are connected by metal to form a first high-voltage terminal electrode.

Preferably, the TVS includes: a first N-type well region located on the right of the first N-type drift region; a third N+ contact region and a second P+ contact region located on the upper part of the first N-type well region; a first anode metal located on the third N+ contact region; a first cathode metal located on the second P+ contact region and a second field oxide region located between the third N+ contact region and the second P+ contact region and partially inside of the first N-type well region. Each electrode metal forms an ohmic contact with the heavily doped contact regions which under the electrode metal.

Preferably, the first cathode metal not only forms an ohmic contact with the second P+ contact region which under the first cathode metal, but also forms a Schottky contact with the first N-type well region at the same time.

Preferably, the TVS part includes: a second N-type well region; a third P+ contact region and a fourth N+ contact region located on the upper part of the second N-type well region; a second P-type well region located on the right of the second N-type well region and tangent to the right edge of the second N-type well region; a fourth P+ contact region and a fifth N+ contact region located on the upper part of the second P-type well region. Among them, the left edge of the third P+ contact region is tangent to the right edge of the fourth N+ contact region and the left side of the fourth P+ contact region is tangent to the right edge of the fifth N+ contact region. The first anode metal forms an ohmic contact with the third P+ contact region and the fourth N+ contact region which under the first anode metal. the first cathode metal forms an ohmic contact with the fourth P+ contact region and the fifth N+ contact region which under the first cathode metal.

Preferably, the device includes: a first P-type implantation region located on the left of the upper part of the second P-type well region and a first N-type trigger region located on the upper part of the boundary between the second N-type well region and the first P-type implantation region. Among them, the left edge of the first P-type implantation region is tangent to the left edge of the second P-type well region and the right edge of the first P-type implantation region is located on the left of the fifth N+ contact region. The left edge of the first N-type trigger region is located inside of the second N-type well region and is located on the right of the third P+ contact region. The right edge of the first N-type trigger region is located inside of the first P-type implantation region. The depth of the first N-type trigger region is shallower than the first P-type implantation region.

Preferably, the device includes: a second high-voltage terminal electrode; a first N+ substrate tangent to the upper surface of the second high-voltage terminal electrode; a first N-type epitaxy layer tangent to the upper surface of the first N+ substrate; a third P-type well region, a fourth P-type well region and a third N-type well region located on the upper part of the first N-type epitaxy layer; a fifth P+ contact region and a sixth N+ contact region located on the upper part of the third P-type well region; a second body electrode metal located on the upper part of the fifth P+ contact region; a second source electrode metal located on the upper part of the sixth N+ contact region; a sixth P+ contact region and a seventh N+ contact region located on the upper part of the fourth P-type well region; a third body electrode metal located on the upper part of the sixth P+ contact region; a third source electrode metal located on the upper part of the seventh N+ contact region; a seventh P+ contact region located on the upper part of the inside of the third N-type well region; a second cathode metal located on the upper part of the seventh P+ contact region; a second gate oxide layer located on the outer upper surface of the first N-type epitaxy layer; and finally a second polysilicon gate electrode located on the second gate oxide layer. Among them, the fourth P-type well region is located on the right of the third P-type well region; the third N-type well region is located on the right of the fourth P-type well region and they are not connected to each other; the right edge of the fifth P+ contact region is tangent to the left edge of the sixth N+ contact region; the left edge of the sixth P+ contact region is tangent to the right edge of the seventh N+ contact region; the left edge of the second gate oxide layer is tangent to the right edge of the sixth N+ contact region and the right edge of the second gate oxide layer is tangent to the left edge of the seventh N+ contact region; the left and right edges of the second polysilicon gate electrode are the same as the second gate oxide layer. Each electrode metal forms an ohmic contact with the heavily doped contact regions which under the electrode metal and the second body electrode metal, the second source electrode metal, the third source electrode metal, the third body electrode metal and the second cathode metal are connected by metal to form a second low voltage terminal electrode.

Preferably, the second cathode metal not only forms ohmic contact with the seventh P+ contact region which under the second cathode metal, but also forms Schottky contact with the third N-type well region at the same time.

Preferably, the third N-type well region can be replaced with a P-type well region, and the required clamping voltage can be achieved by adjusting its junction depth and/or doping concentration.

Preferably, the N-type region in the power device can be changed to the P-type region and the P-type region need to be changed to the N-type region at the same time. The high-voltage electrode of the power device is connected to the anode electrode of the transient voltage suppressor and the low-voltage electrode of the power device is connected to the cathode electrode of the transient voltage suppressor.

Preferably, the power device is selected from LDMOS, VDMOS, JFET, and SIT devices.

Preferably, the substrate materials of the power device and the transient voltage suppressor are selected from bulk silicon or SOI substrate materials.

The advantages of the present invention are as follows:

The invention proposes a power semiconductor device with a low specific on-resistance. By integrating the power device and the transient voltage suppressor together, the clamping characteristics of the transient voltage suppressor are used to reduce the breakdown voltage (BV) demand for the power device. Therefore, due to the relationship between $R_{on,sp}$ and BV, the specific on-resistance of the device can be further reduced, thereby reducing the power loss of the device.

Among them, M1 is the power device, 1 is the gate electrode, 2 is the drain electrode, 3 is the body electrode, 4 is the source electrode, and 5 is the parasitic body diode; T1 is the transient voltage suppressor. 6 is the anode, 7 is the cathode; 8 is the high-voltage terminal electrode, and 9 is the low-voltage end electrode; 101 is the first P+ contact region, 102 is the second P+ contact region, 103 is the first P-type well region, 104 is the P-type substrate, 105 is the third P+ contact region, 106 is the fourth P+ contact region, 107 is the second P-type well region, and 108 is the first P-type implantation region; 111 is the first N+ contact region, 112 is the second N+ contact region, 113 is the third N+ contact region, 114 is the first N-type drift region, 115 is the first N-type well region, 116 is the fourth N+ contact region, 117 is the fifth N+ contact region, 118 is the second N-type well region, and 119 is the first N-type trigger region; 131 is the first low-voltage terminal electrode, 132 is the first high-voltage terminal electrode, 140 is the first gate oxide layer, 141 is the first field oxide region, 142 is the second field oxide region, 150 is the first polysilicon gate electrode, 151 is the first body electrode metal, 152 is the first source electrode metal, 153 is the first drain electrode metal, 154 is the first anode metal, and 155 is the first cathode metal; 201 is the fifth P+ contact region, 202 is the sixth P+ contact region, 203 is the seventh P+ contact region, 204 is the third P-type well region, and 205 is the fourth P-type well region; 211 is the sixth N+ contact region, 212 is the seventh N+ contact region, 213 is the first N-type epitaxy layer, 214 is the first N+ substrate, and 215 is the third N-type well region; 231 is the second low-voltage terminal electrode, 232 is the second high-voltage terminal electrode, 240 is the second gate oxide layer, 250 is the second polysilicon gate electrode, 251 is the second body electrode metal, 252 is the second source electrode metal, 253 is the third source electrode metal, 254 is the third body electrode metal, and 255 is the second cathode metal.

DETAILED DESCRIPTION OF THE EMBODIMENTS

The embodiments of the present invention are described through the following specific examples, and those skilled in the art can easily understand more advantages and effects of the present invention by reading the disclosure of the specification. The present invention can also be implemented or applied by different specific embodiments, and the details in the specification can be modified or changed based on different viewpoints and applications without departing from the spirit of the present invention.

Embodiment 1

Figure 2:
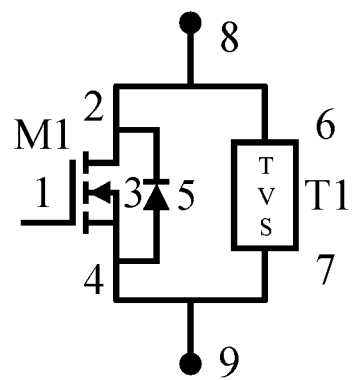
FIG. 2 is a schematic diagram of embodiment 1.

FIG. 2 shows the structure of the device of the low specific on-resistance power semiconductor device, which includes: a power device M1 which includes a gate electrode 1, a drain electrode 2, a bulk electrode 3, a source electrode 4 and a parasitic body diode 5. And the bulk electrode 3 and the source electrode 4 are shorted. A transient voltage suppressor (TVS) T1 includes an anode electrode 6 and a cathode electrode 7. The drain electrode 2 of the power device M1 and the anode electrode 6 of the TVS T1 are connected by metal to form a high-voltage terminal electrode 8. The source electrode 4 of the power device M1 and the cathode electrode 7 of the TVS T1 are connected by metal to form a low-voltage terminal electrode 9.

Mechanism of this Embodiment

Figure 1A:
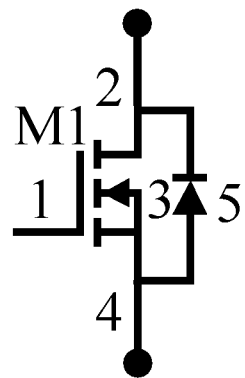
FIG. 1A is a schematic diagram of a traditional power device.
Figure 1B:
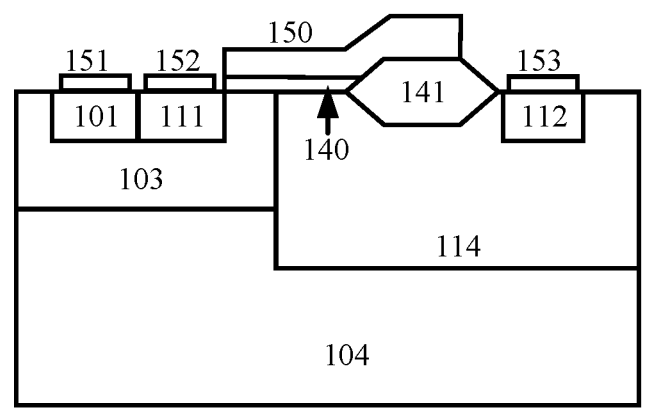
FIG. 1B is a schematic cross-sectional view of a conventional lateral power device.
Figure 1C:
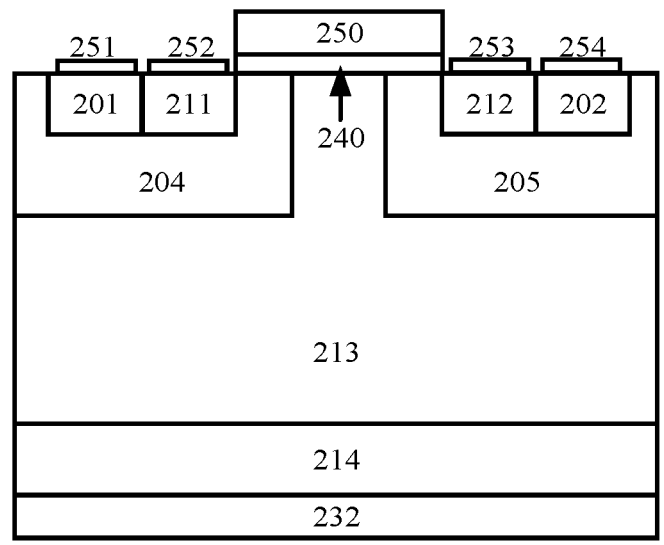
FIG. 1C is a schematic cross-sectional view of a conventional vertical power device.
Figure 3A:
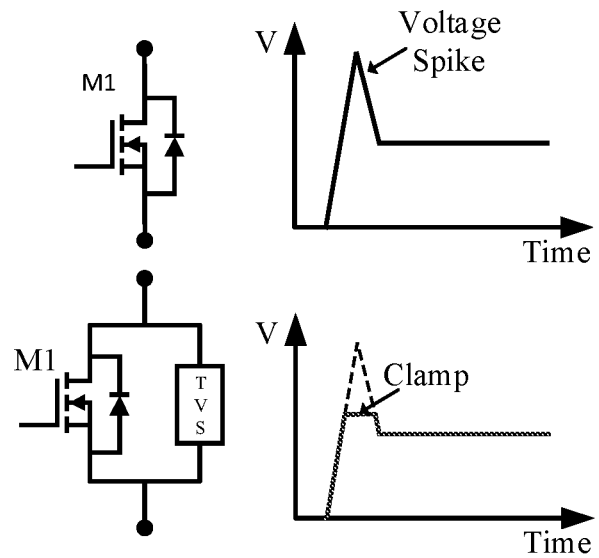
FIG. 3A is a comparison diagram between a conventional power device and embodiment 1.
Figure 3B:
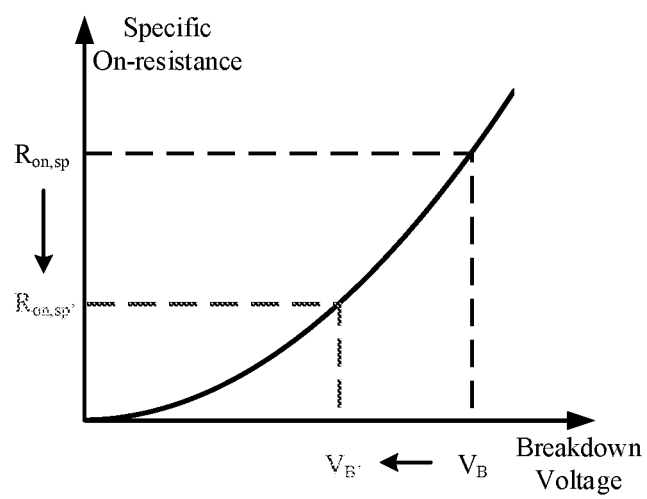
FIG. 3B is a schematic diagram of embodiment 1.

Since the circuit using power devices usually has inductive loads, when the current of inductive loads changes suddenly, a voltage spike will occur across the inductor, which may damage other components. Therefore, the breakdown voltage of power devices is generally required to be much higher than its operating voltage. In order to achieve a high breakdown voltage, high-voltage power devices are required to have a low doping concentration in the drift region used to withstand the voltage. But in order to meet a low on-resistance, a high doping concentration is required for the drift region as a current channel. Therefore, there is a limit relationship between the breakdown voltage and the specific on-resistance of the power device. As shown in FIG. 1A, there is a parasitic body diode in the power device. As shown in FIG. 1B, the body diode of the conventional lateral power device LDMOS is composed of the P+ contact region, the P-type well region, the N-type drift region and the N+ contact region. As shown in FIG. 1C, the body diode of the conventional vertical power device VDMOS is composed of the P+ contact region, the P-type well region, the N-type epitaxy layer and the N+ substrate. It can be seen that the trigger voltage of the parasitic body diode is still determined by the reverse-biased PN junction formed by the N-type drift region or the N-type epitaxy layer and the P-type well region. Therefore, the trigger voltage of the parasitic body diode is basically the same as the breakdown voltage of the power device. And it does not play the role of clamping voltage, i.e., the requirements for the breakdown voltage of power devices have not changed. The present invention integrates the transient voltage suppressor with the power device, and the difference from the body diode is that the trigger voltage of the transient voltage suppressor is not directly related to the breakdown voltage of the power device, and can be adjusted according to demand. As shown in FIG. 3A, when a voltage spike occurs across the power device, the transient voltage suppressor can be triggered very quickly and clamp the voltage across the power device to a predetermined value; when the power device works normally, the transient voltage suppressor is turned off, which would not affect the normal operating state of the power device. In this way, as shown in FIG. 3B, the breakdown voltage requirement of the power device can be appropriately reduced. Due to the limit relationship between the breakdown voltage and the specific on-resistance, when the breakdown voltage requirement decreases, the specific on-resistance value also decreases simultaneously. As a result, lower power loss of power devices is realized. In addition, power devices generally have a larger area due to their current capability requirement. In comparison, the area required to integrate a transient voltage suppressor can be ignored.

Embodiment 2

Figure 4:
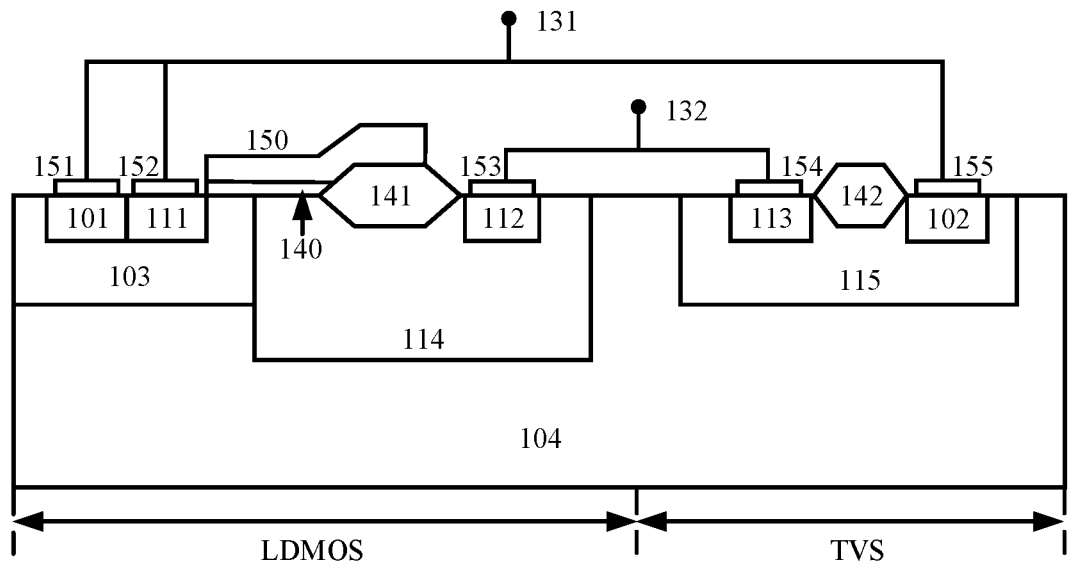
FIG. 4 is a cross-sectional schematic of embodiment 2.

As shown in FIG. 4, this embodiment specifically illustrates a cross-sectional schematic diagram of the integration of a lateral power device and a transient voltage suppressor, which includes: a P-type substrate 104; a first P-type well region 103 located on the left of an upper part of the P-type substrate 104; a first N-type drift region 114 tangent to the right edge of the first P-type well region 103; a first N-type well region 115 located on the right of the first N-type drift region 114; a first P+ contact region 101 and a first N+ contact region 111 located on the upper part of the first P-type well region 103; a first bulk electrode metal 151 located on the first P+ contact region 101; a first source electrode metal 152 located on the first N+ contact region 111; a second N+ contact region 112 located on the right of the upper part of the first N-type drift region 114; a first drain electrode metal 153 located on the second N+ contact region 112; a third N+ contact region 113 and a second P+ contact region 102 located on the upper part of the first N-type well region 115; a first anode metal 154 located on the third N+ contact region 113; a first cathode metal 155 located on the second P+ contact region 102; a first field oxide region 141 located on the left of the second N+ contact region 112 and partially inside of the first N-type drift region 114; a second field oxide region 142 located between the third N+ contact region 113 and the second P+ contact region 102 and partially inside of the first N-type well region 115; a first gate oxide layer 140 located on the upper surface of the P-type substrate 104; and a first polysilicon gate electrode 150 located on the upper surfaces of the first gate oxide layer 140 and the first field oxide region 141. Among them, the left edge of the first gate oxide layer 140 is tangent to the right edge of the first N+ contact region 111, and the right edge of the first gate oxide layer 140 is connected to the first field oxide region 141. Each electrode metal forms an ohmic contact with the heavily doped contact regions which under the electrode metal. The first bulk electrode metal 151, the first source electrode metal 152 and the first cathode metal 155 of the TVS are connected by metal to form a first low-voltage terminal electrode 131. The first drain electrode metal 153 and the first anode metal 154 of the TVS are connected by metal to form a first high-voltage terminal electrode 132.

Embodiment 3

Figure 5:
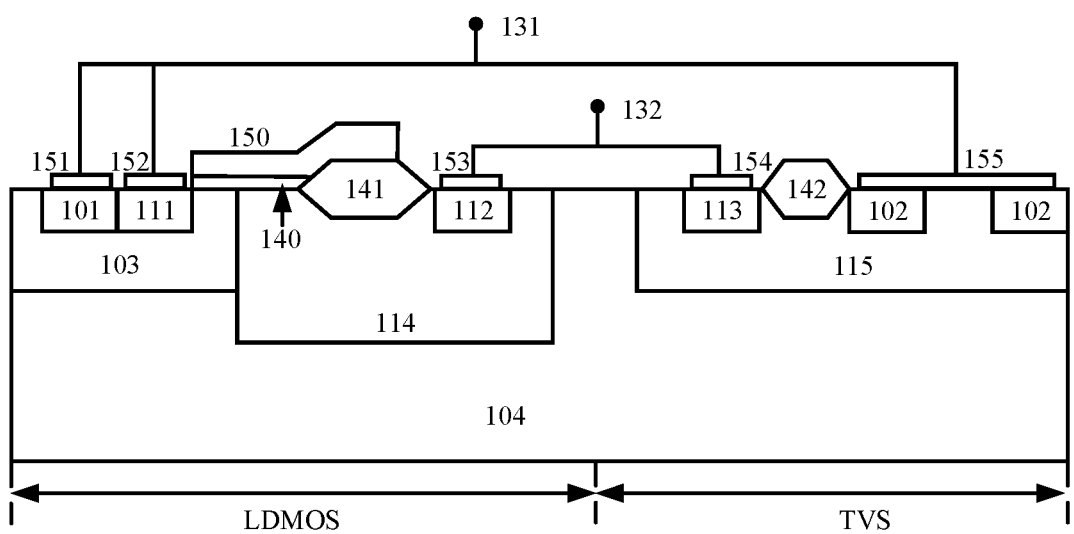
FIG. 5 is a cross-sectional schematic of embodiment 3.

As shown in FIG. 5, the difference between this embodiment and embodiment 2 is that: the first cathode metal 155 not only forms an ohmic contact with the second P+ contact region 102 which under the first cathode metal 155, but also forms a Schottky contact with the first N-type well region 115 at the same time.

Embodiment 4

Figure 6:
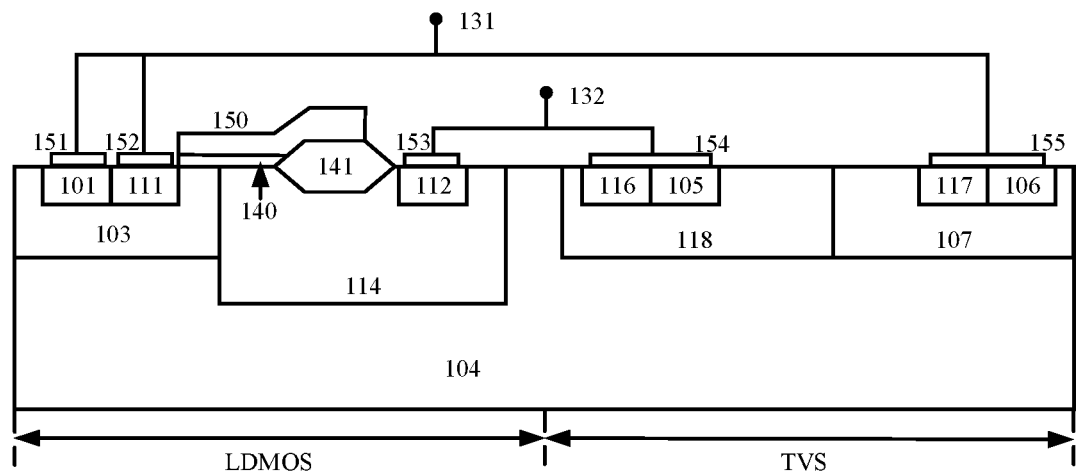
FIG. 6 is a cross-sectional schematic of embodiment 4.

As shown in FIG. 6, the difference between this embodiment and embodiment 2 is that: the TVS part includes: a second N-type well region 118; a third P+ contact region 105 and a fourth N+ contact region 116 located on the upper part of the second N-type well region 118; a second P-type well region 107 located on the right of the second N-type well region 118 and tangent to the right edge of the second N-type well region 118; a fourth P+ contact region 106 and a fifth N+ contact region 117 located on the upper part of the second P-type well region 107. Among them, the left edge of the third P+ contact region 105 is tangent to the right edge of the fourth N+ contact region 116 and the left side of the fourth P+ contact region 106 is tangent to the right edge of the fifth N+ contact region 117. The first anode metal 154 forms an ohmic contact with the third P+ contact region 105 and the fourth N+ contact region 116 which under the first anode metal 154; the first cathode metal 155 forms an ohmic contact with the fourth P+ contact region 106 and the fifth N+ contact region 117 which under the first cathode metal 155.

Embodiment 5

Figure 7:
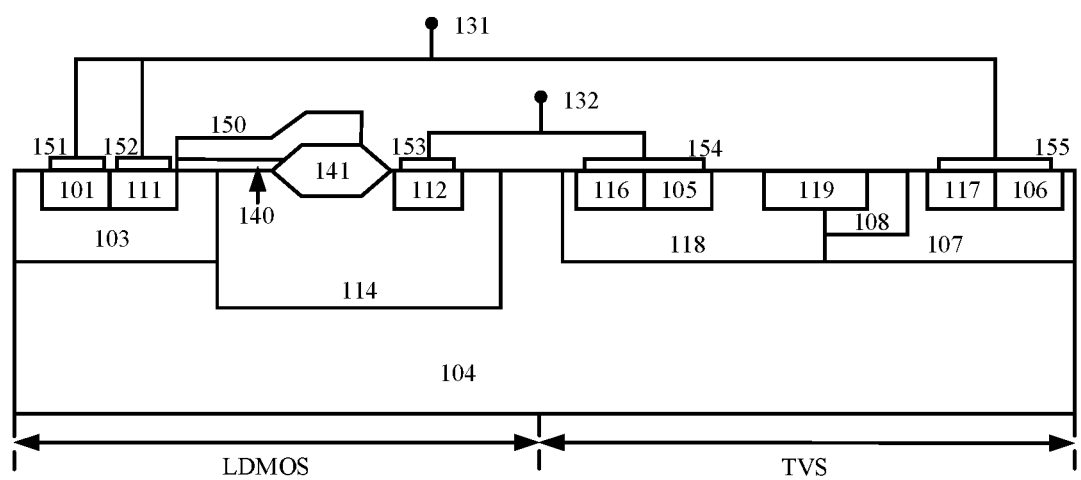
FIG. 7 is a cross-sectional schematic of embodiment 5.

As shown in FIG. 7 the difference between this embodiment and embodiment 4 is that: a first P-type implantation region 108 located on the left of the upper part of the second P-type well region 107 and a first N-type trigger region 119 located on the upper part of the boundary between the second N-type well region 118 and the first P-type implantation region 108. Among them, the left edge of the first P-type implantation region 108 is tangent to the left edge of the second P-type well region 107 and the right edge of the first P-type implantation region 108 is located on the left of the fifth N+ contact region 117; the left edge of the first N-type trigger region 119 is located inside of the second N-type well region 118 and is located on the right of the third P+ contact region 105. The right edge of the first N-type trigger region 119 is located inside of the first P-type implantation region 108. The depth of the first N-type trigger region 119 is shallower than the first P-type implant region 108.

Embodiment 6

Figure 8:
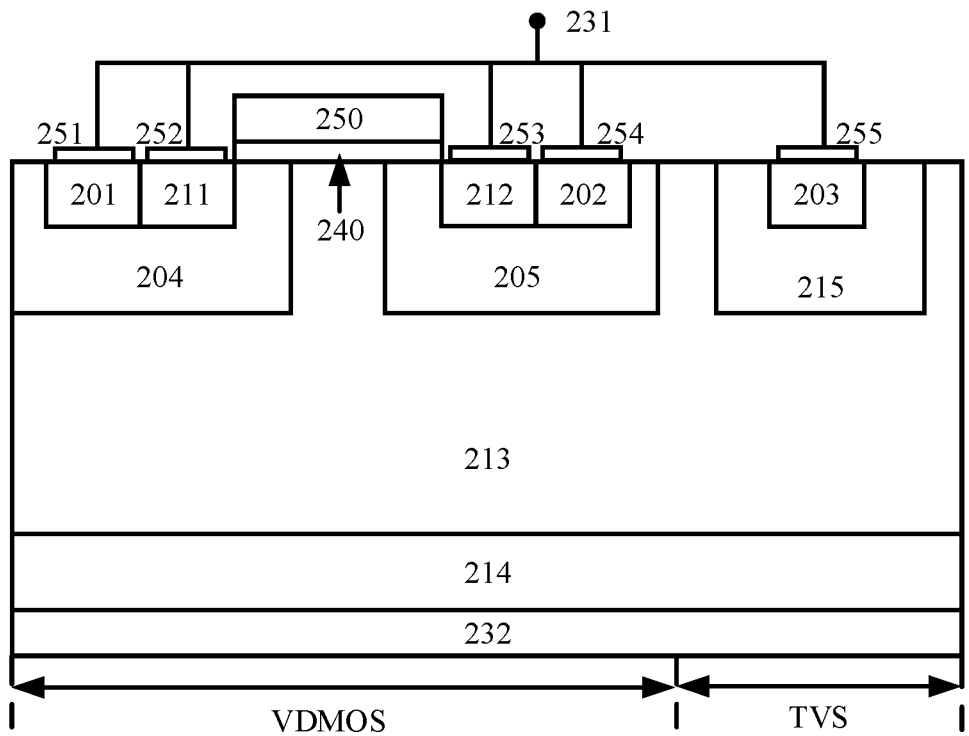
FIG. 8 is a cross-sectional schematic of embodiment 6.

As shown in FIG. 8, This embodiment specifically shows a cross-sectional schematic diagram of the integration of a vertical power device and a transient voltage suppressor, which includes: a second high-voltage terminal electrode 232; a first N+ substrate 214 tangent to the upper surface of the second high-voltage terminal electrode 232; a first N-type epitaxy layer 213 tangent to the upper surface of the first N+ substrate 214; a third P-type well region 204, a fourth P-type well region 205 and a third N-type well region 215 located on the upper part of the first N-type epitaxy layer 213; a fifth P+ contact region 201 and a sixth N+ contact region 211 located on the upper part of the third P-type well region 204; a second body electrode metal 251 located on the upper part of the fifth P+ contact region 201; a second source electrode metal 252 located on the upper part of the sixth N+ contact region 211; a sixth P+ contact region 202 and a seventh N+ contact region 212 located on the upper part of the fourth P-type well region 205; a third body electrode metal 254 located on the upper part of the sixth P+ contact region 202; a third source electrode metal 253 located on the upper part of the seventh N+ contact region 212; a seventh P+ contact region 203 located on the upper part of the inside of the third N-type well region 215; a second cathode metal 255 located on the upper part of the seventh P+ contact region 203; a second gate oxide layer 240 located on the outer upper surface of the first N-type epitaxy layer 213; and finally a second polysilicon gate electrode 250 located on the second gate oxide layer 240. Among them, the fourth P-type well region 205 is located on the right of the third P-type well region 204; the third N-type well region 215 is located on the right of the fourth P-type well region 205 and they are not connected to each other; the right edge of the fifth P+ contact region 201 is tangent to the left edge of the sixth N+ contact region 211; the left edge of the sixth P+ contact region 202 is tangent to the right edge of the seventh N+ contact region 212; the left edge of the second gate oxide layer 240 is tangent to the right edge of the sixth N+ contact region 211 and the right edge of the second gate oxide layer 240 is tangent to the left edge of the seventh N+ contact region 212; the left and right edges of the second polysilicon gate electrode 250 are the same as the second gate oxide layer 240. Each electrode metal forms an ohmic contact with the heavily doped contact regions which under the electrode metal and the second body electrode metal 251, the second source electrode metal 252, the third source electrode metal 253, the third body electrode metal 254 and the second cathode metal 255 are connected by metal to form a second low voltage terminal electrode 231.

Embodiment 7

Figure 9:
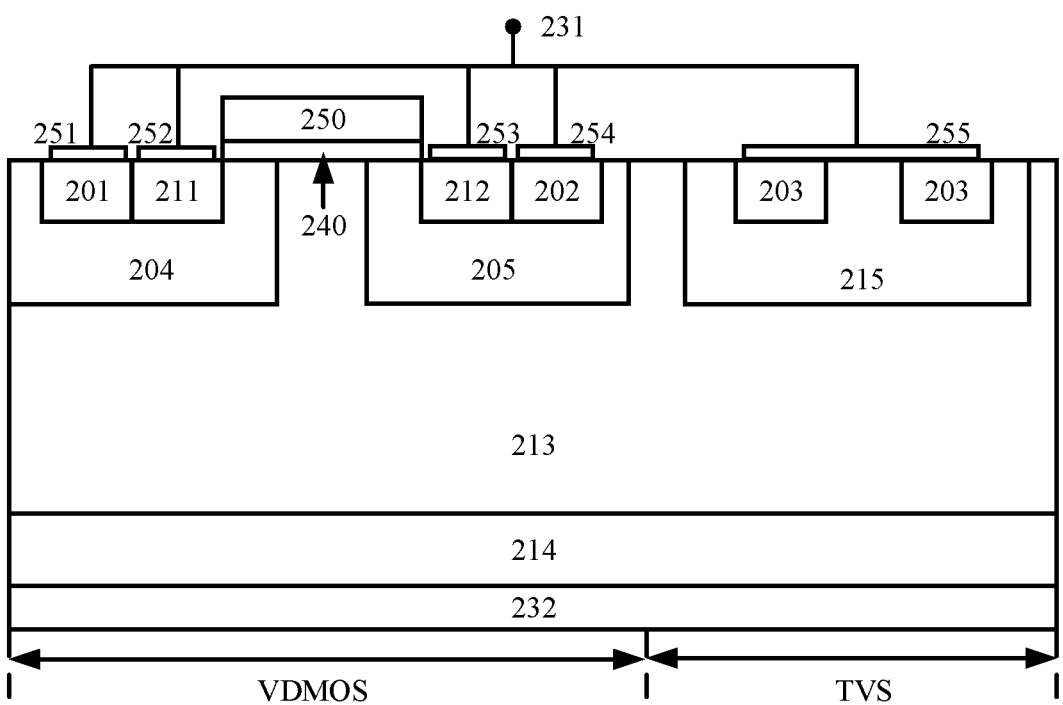
FIG. 9 is a cross-sectional schematic of embodiment 7.

As shown in FIG. 9, the difference between this embodiment and embodiment 6 is that: the second cathode metal 255 not only forms ohmic contact with the seventh P+ contact region 203 which under the second cathode metal 255, but also forms Schottky contact with the third N-type well region 215 at the same time.

What is claimed is:

1. A low-on-resistance power semiconductor device, comprising: a power device, wherein the power device comprises a gate electrode; a drain electrode; a bulk electrode; a source electrode and a parasitic body diode; the bulk electrode and the source electrode are shorted; a transient voltage suppressor (TVS) comprises an anode electrode and a cathode electrode; the drain electrode of the power device and the anode electrode of the TVS are connected by a first metal to form a high-voltage terminal electrode, the source electrode of the power device and the cathode electrode of the TVS are connected by a second metal to form a low-voltage terminal electrode; a P-type substrate; a first P-type well region located on a left of an upper part of the P-type substrate; a first N-type drift region tangent to a right edge of the first P-type well region; the TVS located on a right of the first N-type drift region; a first P+ contact region and a first N+ contact region located on an upper part of the first P-type well region; a first bulk electrode metal located on the first P+ contact region; a first source electrode metal located on the first N+ contact region; a second N+ contact region located on a right of an upper part of the first N-type drift region; a first drain electrode metal located on the second N+ contact region; a first field oxide region located on a left of the second N+ contact region and partially inside of the first N-type drift region; a first gate oxide layer located on an upper surface of the P-type substrate; and a first polysilicon gate electrode located on an upper surface of the first gate oxide layer and an upper surface of the first field oxide region; wherein a left edge of the first gate oxide layer is tangent to a right edge of the first N+ contact region, and a right edge of the first gate oxide layer is connected to the first field oxide region, each electrode metal forms an ohmic contact with a plurality of heavily doped contact regions under the each electrode metal, the first bulk electrode metal, the first source electrode metal and a first cathode metal of the TVS are connected by a third metal to form a first low-voltage terminal electrode, the first drain electrode metal and a first anode metal of the TVS are connected by a fourth metal to form a first high-voltage terminal electrode.

2. The low-on-resistance power semiconductor device according to claim 1, wherein the TVS comprises: a first N-type well region located on the right of the first N-type drift region; a third N+ contact region and a second P+ contact region located on an upper part of the first N-type well region; the first anode metal located on the third N+ contact region; the first cathode metal located on the second P+ contact region and a second field oxide region located between the third N+ contact region and the second P+ contact region and partially inside of the first N-type well region, the each electrode metal forms the ohmic contact with the plurality of heavily doped contact regions under the each electrode metal.

3. The low-on-resistance power semiconductor device according to claim 2, wherein the first cathode metal forms the ohmic contact with the second P+ contact region under the first cathode metal and forms a Schottky contact with the first N-type well region at the same time.

4. The low-on-resistance power semiconductor device according to claim 1, wherein the TVS comprises: a second N-type well region; a third P+ contact region and a fourth N+ contact region located on an upper part of the second N-type well region; a second P-type well region located on a right of the second N-type well region and tangent to a right edge of the second N-type well region; a fourth P+ contact region and a fifth N+ contact region located on an upper part of the second P-type well region; wherein a left edge of the third P+ contact region is tangent to a right edge of the fourth N+ contact region and a left side of the fourth P+ contact region is tangent to a right edge of the fifth N+ contact region, the first anode metal forms the ohmic contact with the third P+ contact region and the fourth N+ contact region under the first anode metal, the first cathode metal forms the ohmic contact with the fourth P+ contact region and the fifth N+ contact region under the first cathode metal.

5. The low-on-resistance power semiconductor device according to claim 4, further comprising: a first P-type implantation region located on a left of the upper part of the second P-type well region and a first N-type trigger region located on an upper part of a boundary between the second N-type well region and the first P-type implantation region; wherein a left edge of the first P-type implantation region is tangent to a left edge of the second P-type well region and a right edge of the first P-type implantation region is located on a left of the fifth N+ contact region, a left edge of the first N-type trigger region is located inside of the second N-type well region and is located on a right of the third P+ contact region, a right edge of the first N-type trigger region is located inside of the first P-type implantation region, a depth of the first N-type trigger region is shallower than a depth of the first P-type implantation region.

6. The low-on-resistance power semiconductor device according to claim 1, wherein an N-type region in the power device is changed to a P-type region and the P-type region is changed to the N-type region at the same time, a high-voltage electrode of the power device is connected to the anode electrode of the TVS and a low-voltage electrode of the power device is connected to the cathode electrode of the TVS.

7. The low-on-resistance power semiconductor device according to claim 1, wherein the power device is at least one selected from the group consisting of LDMOS, VDMOS, JFET, and SIT devices.

8. The low-on-resistance power semiconductor device according to claim 1, wherein a substrate material of the power device and a substrate material of the TVS are selected from bulk silicon or SOI substrate materials.

9. The low-on-resistance power semiconductor device according to claim 2, wherein an N-type region in the power device is changed to a P-type region and the P-type region is changed to the N-type region at the same time, a high-voltage electrode of the power device is connected to the anode electrode of the TVS and a low-voltage electrode of the power device is connected to the cathode electrode of the TVS.

10. The low-on-resistance power semiconductor device according to claim 3, wherein an N-type region in the power device is changed to a P-type region and the P-type region is changed to the N-type region at the same time, a high-voltage electrode of the power device is connected to the anode electrode of the TVS and a low-voltage electrode of the power device is connected to the cathode electrode of the TVS.

11. The low-on-resistance power semiconductor device according to claim 4, wherein an N-type region in the power device is changed to a P-type region and the P-type region is changed to the N-type region at the same time, a high-voltage electrode of the power device is connected to the anode electrode of the TVS and a low-voltage electrode of the power device is connected to the cathode electrode of the TVS.

12. The low-on-resistance power semiconductor device according to claim 5, wherein an N-type region in the power device is changed to a P-type region and the P-type region is changed to the N-type region at the same time, a high-voltage electrode of the power device is connected to the anode electrode of the TVS and a low-voltage electrode of the power device is connected to the cathode electrode of the TVS.

13. A low-on-resistance power semiconductor device, comprising: a power device, wherein the power device comprises a gate electrode; a drain electrode; a bulk electrode; a source electrode and a parasitic body diode; the bulk electrode and the source electrode are shorted; a transient voltage suppressor (TVS) comprises an anode electrode and a cathode electrode; the drain electrode of the power device and the anode electrode of the TVS are connected by a first metal to form a high-voltage terminal electrode, the source electrode of the power device and the cathode electrode of the TVS are connected by a second metal to form a low-voltage terminal electrode; a second high-voltage terminal electrode; a first N+ substrate tangent to an upper surface of the second high-voltage terminal electrode; a first N-type epitaxy layer tangent to an upper surface of the first N+ substrate; a third P-type well region, a fourth P-type well region and a third N-type well region located on an upper part of the first N-type epitaxy layer; a fifth P+ contact region and a sixth N+ contact region located on an upper part of the third P-type well region; a second body electrode metal located on an upper part of the fifth P+ contact region; a second source electrode metal located on an upper part of the sixth N+ contact region; a sixth P+ contact region and a seventh N+ contact region located on an upper part of the fourth P-type well region; a third body electrode metal located on an upper part of the sixth P+ contact region; a third source electrode metal located on an upper part of the seventh N+ contact region; a seventh P+ contact region located on an upper part of an inside of the third N-type well region; a second cathode metal located on an upper part of the seventh P+ contact region; a second gate oxide layer located on an outer upper surface of the first N-type epitaxy layer; and finally a second polysilicon gate electrode located on the second gate oxide layer; wherein the fourth P-type well region is located on a right of the third P-type well region; the third N-type well region is located on a right of the fourth P-type well region and the fourth P-type well region and the third N-type well region are not connected to each other; a right edge of the fifth P+ contact region is tangent to a left edge of the sixth N+ contact region; a left edge of the sixth P+ contact region is tangent to a right edge of the seventh N+ contact region; a left edge of the second gate oxide layer is tangent to a right edge of the sixth N+ contact region and a right edge of the second gate oxide layer is tangent to a left edge of the seventh N+ contact region; a left edge and a right edge of the second polysilicon gate electrode are same as the second gate oxide layer, each electrode metal forms an ohmic contact with a plurality of heavily doped contact regions under the each electrode metal and the second body electrode metal, the second source electrode metal, the third source electrode metal, the third body electrode metal and the second cathode metal are connected by a third metal to form a second low voltage terminal electrode.

14. The low-on-resistance power semiconductor device according to claim 13, wherein the second cathode metal forms the ohmic contact with the seventh P+ contact region under the second cathode metal and forms a Schottky contact with the third N-type well region at the same time.

15. The low-on-resistance power semiconductor device according to claim 13, wherein the third N-type well region is replaced with a P-type well region, and a required clamping voltage is achieved by adjusting a junction depth and/or a doping concentration.

16. The low-on-resistance power semiconductor device according to claim 13, wherein an N-type region in the power device is changed to a P-type region and the P-type region is changed to the N-type region at the same time, a high-voltage electrode of the power device is connected to the anode electrode of the TVS and a low-voltage electrode of the power device is connected to the cathode electrode of the TVS.

17. The low-on-resistance power semiconductor device according to claim 14, wherein an N-type region in the power device is changed to a P-type region and the P-type region is changed to the N-type region at the same time, a high-voltage electrode of the power device is connected to the anode electrode of the TVS and a low-voltage electrode of the power device is connected to the cathode electrode of the TVS.

18. The low-on-resistance power semiconductor device according to claim 15, wherein an N-type region in the power device is changed to a P-type region and the P-type region is changed to the N-type region at the same time, a high-voltage electrode of the power device is connected to the anode electrode of the TVS and a low-voltage electrode of the power device is connected to the cathode electrode of the TVS.

* * * * *